United States Patent [19]

Badyal et al.

[11] Patent Number: 5,369,310
[45] Date of Patent: Nov. 29, 1994

[54] CMOS POWER-ON RESET CIRCUIT

[75] Inventors: Rajeev Badyal, Corvallis, Oreg.; Vernon Knowles, Boise, Id.

[73] Assignee: Hewlett-Packard Corporation, Palo Alto, Calif.

[21] Appl. No.: 891,587

[22] Filed: Jun. 1, 1992

[51] Int. Cl.$^5$ .................... H03K 17/28; H03K 5/24
[52] U.S. Cl. .................................. 327/143; 327/198; 327/546
[58] Field of Search .............. 307/272.3, 296.5, 296.4, 307/594, 595, 597, 296.6, 355, 350, 494

[56] References Cited

U.S. PATENT DOCUMENTS

| | | | |
|---|---|---|---|
| 3,965,388 | 6/1976 | Brisk | 302/355 |
| 4,473,759 | 9/1984 | Mahabadi | 302/355 |
| 4,788,462 | 11/1988 | Vesce et al. | 302/592 |
| 5,006,738 | 4/1991 | Usuki et al. | 307/594 |
| 5,109,163 | 4/1992 | Benhamida | 307/272.3 |
| 5,115,146 | 5/1992 | McClure | 307/272.3 |

FOREIGN PATENT DOCUMENTS

PCT/US90/-
06301 11/1990 WIPO .

OTHER PUBLICATIONS

Texas Instruments Data Book, "TL7702A, TL7705A, TL7709A, TL7712A, TL7715A Supply Voltage Supervisors", Revised Oct. 1988.
Shorthill, "Power Supply Voltage Monitors Maintain Microprocessors Data Integrity", *PCIM*, Jun. 1990.

*Primary Examiner*—Timothy P. Callahan
*Assistant Examiner*—Dinh Le

[57] ABSTRACT

A CMOS power-on reset circuit has a delay capacitor to provide a predetermined delay period. Charging and discharging of the delay capacitor is controlled by the state of a flipflop circuit. An input comparator monitors a power supply input voltage. An invalid input voltage level immediately changes the reset output signal to the invalid state and discharges the capacitor. Even after the input voltage has recovered to a valid level, recharging the capacitor is delayed until the capacitor has substantially discharged, thereby ensuring at least a predetermined delay period after the last fault condition. The delay capacitor is coupled in a feedback configuration so as to lower the threshold voltage when the delay capacitor voltage indicates to the valid state, to allow limited power supply sag, for example due to motor start-up, without resetting the circuit. Multiple power supply voltages are continuously monitored in a CMOS integrated configuration by additional input scaling resistor networks and input comparators, all coupled to the common 2-level threshold voltage node.

11 Claims, 5 Drawing Sheets

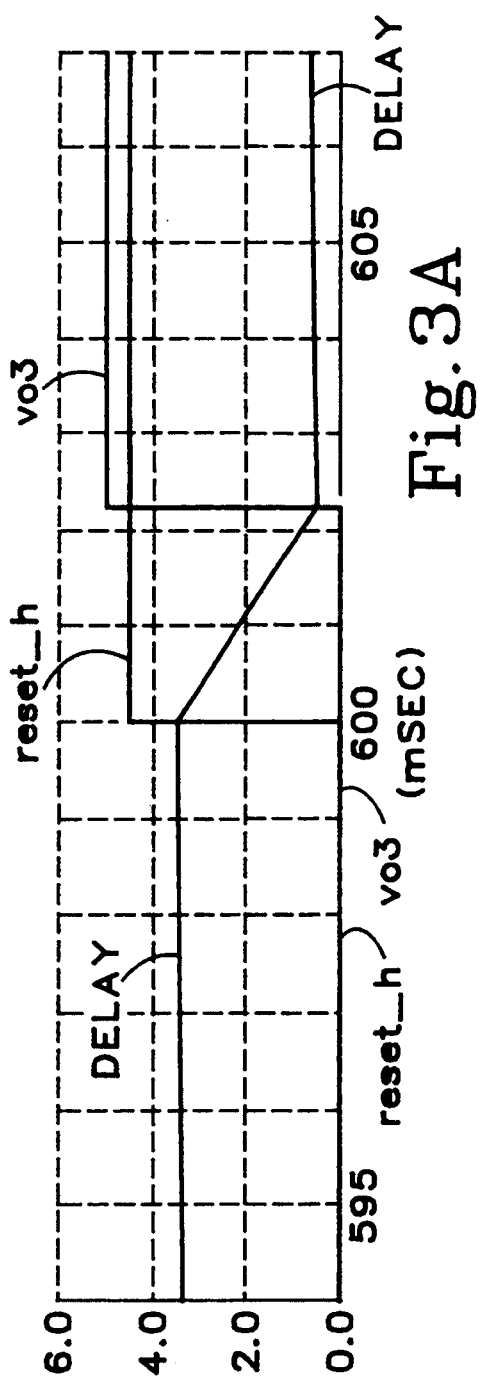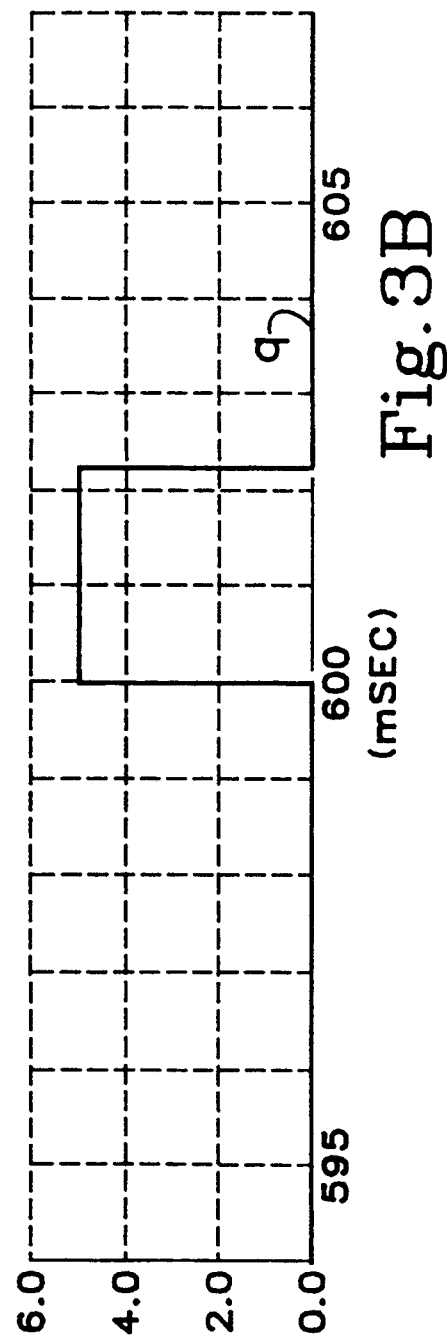

CMOS POWER-ON RESET CIRCUIT

This invention relates generally to methods and circuits for generating a reset signal useful for resetting electronic circuitry to a predetermined state responsive to power-up of a power supply, or following a dip or glitch in the power supply voltage. More specifically, this invention relates to a power-on reset method and circuits for implementing the method for precision applications in CMOS integrated circuit technology.

BACKGROUND OF THE INVENTION

Electronic circuits, particularly logic circuits including microprocessors, are powered by at least one external power supply. When a power supply is initially turned on, the powered logic circuits must be initialized to a known state. Even after such circuitry has been initialized and is operating properly, the power supply voltage may for some reason dip or glitch unexpectedly, causing the logic circuitry to change state or otherwise operate improperly. It is therefore necessary to continuously monitor the power supply voltage and to reset the logic circuitry following such a glitch, after the power supply voltage reaches a predetermined minimum voltage adequate for proper operation. A reset operation, upon initial power-up or after a power supply glitch, is effected by a power-on reset logic signal. The present invention relates to monitoring power supply voltages and providing such a reset signal.

In the past, external reset circuits comprising discrete components have been utilized to provide a reset signal to an integrated circuit such as a microprocessor. Other types of voltage monitoring circuits have been used to monitor AC power lines. For example, international patent application no. PCT/US90/06301 owned by Voltage Control, Inc. discloses a discrete, analog circuit for monitoring an AC line voltage and disconnecting AC powered user equipment from the AC power line whenever the AC power line voltage is outside a predetermined operating voltage window. Use of discrete components is undesirable for most applications because of their large size and the cost of implementing discrete components.

Benhamida U.S. Pat. No. 5,109,163 discloses a power-on reset circuit which may be implemented as part of an integrated circuit chip including a microprocessor or other logic circuitry which may require initialization at powerup. U.S. Pat. No. 5,115,146 also shows an integrated power-on circuit. Monolithic power-on reset circuits are commercially available in bipolar technology. Examples of such devices are the TL7702 series of "supply voltage supervisors" made by Texas Instruments and the Fujitsu device number MV 3771.

Prior art power-on circuits provide for a timing capacitor (internal or external) to provide a delay period after a monitored power supply voltage is valid before asserting the reset signal. This assures that the power supply voltage has stabilized. Typically, the reset signal is derived from the capacitor node and is asserted when the capacitor is sufficiently charged. When the power supply voltage drops to an invalid level, a transistor switch discharges the timing capacitor. After the capacitor is sufficiently discharged, the reset signal changes to the invalid state. For example, the Fujitsu part No. MB 3771 employs an NPN transistor arranged to discharge an external timing capacitor (node $C_T$) when the monitored voltage becomes invalid. The reset output signal is derived from that capacitor node so that, after the capacitor is sufficiently discharged, the reset output signal changes state. A similar approach is shown in Benhamida U.S. Pat. No. 5,109,163 (see FIG. 1, internal capacitor node C). In the prior art, switching the reset signal to the invalid state thus must await discharge of the timing capacitor. Discharging the timing capacitor introduces delay after the power supply voltage has dropped before asserting the reset signal. Such delay can lead to malfunction, particularly in high-speed systems. A need remains for asserting a reset signal to indicate an invalid power supply voltage without delay whenever the power supply voltage drops to an invalid level.

The prior art discrete and bipolar circuits are not amenable to implementation in CMOS technology. Moreover, both the circuits disclosed in the '163 patent (Benhamida) as well as the bipolar monolithic solutions suffer several common shortcomings. First, some prior art circuits employ input comparators with hysteresis. Hysteresis on the input has been found to be of little benefit. This is because, after an initial fault condition occurs, a relatively long delay period ensues during which the input is ignored. Additionally, hysteresis adds to the size and complexity of the comparators and makes it difficult to expand such reset circuits to monitor multiple power supply voltages.

The need remains, therefore, for an improved method of providing a power-on reset signal in a CMOS integrated system, and for circuitry for implementing such a method that is relatively simple and therefore compact in size. It would also be desirable to provide a power-on reset circuit which obviates providing hysteresis in the input stage. The need also remains for providing an immediate indication of an invalid power supply voltage level.

Additionally, many integrated circuit systems require multiple power supply voltages. For example, a typical CMOS circuit may require both a +5 VDC supply (VDD) and a +12 VDC supply (VHH). It is therefore desirable to provide for monitoring multiple power supply voltages in a power-on reset circuit while minimizing circuit size and complexity.

SUMMARY OF THE INVENTION

An object of the invention is to provide accurate power supply voltage monitoring in a CMOS integrated circuit.

Another object of the invention is to provide a reset logic signal that immediately changes state in response to an invalid power supply voltage.

A further object is to simultaneously monitor multiple power supply voltages in a simple and compact integrated circuit.

One aspect of the invention is a power-on circuit for generating a binary reset output signal having a valid state and an invalid state. The invalid state of the reset output signal indicates that one or more power supply voltages has fallen below a predetermined minimum level acceptable for normal operation. In other words, a supply voltage has become "invalid". It may have done so only momentarily, i.e in a glitch, or over a longer period. The power-on reset output signal does not become valid until the input power supply voltage has remained continuously above its minimum valid level.

The power-on circuit includes a resistive divider network for receiving and scaling a power supply voltage (PORVDD) to be monitored. A threshold voltage is derived from a reference voltage. A first comparator is employed to compare the scaled power supply voltage to the threshold voltage. The comparator output indicates a valid power supply state when the scaled power supply voltage exceeds the threshold voltage, and indicates an invalid power supply state otherwise.

A delay timer provides a predetermined delay period. Logic circuitry starts the delay timer responsive to the indication of a valid power supply state. However, further logic delays said starting the delay timer until after the delay timer indicates completion of the delay period. This ensures that at least the delay period elapses since the power supply last becoming invalid before changing the reset output signal to the valid state.

Additional logic is coupled to the first comparator for forcing the reset output signal to an invalid state responsive to the indication of an invalid power supply state and without regard to the delay period, thereby immediately forcing the reset signal to the invalid state without delay.

Preferably, the invention is implemented in a CMOS integrated circuit wherein the delay timer includes an RS flipflop. A delay capacitor stores a capacitor voltage. Means are provided for charging the delay capacitor while an intermediate signal, i.e. the flipflop Q output signal, is in a first state and for discharging the delay capacitor while the intermediate signal is in a second state.

A second comparator monitors the delay capacitor voltage and compares it to a predetermined reference voltage to determine when the delay capacitor is substantially discharged. Recharging the capacitor is delayed, even after the power supply voltage is valid, until the capacitor is substantially discharged. The time to recharge the capacitor from that discharged state defines the delay period.

Circuitry for starting the delay timer thus is coupled to the first comparator for setting the intermediate logic signal to the first state to begin charging the delay capacitor responsive to the indication of a valid power supply state; and delaying means includes the second comparator and is coupled to the first comparator for setting the intermediate logic signal (q) to the second state to begin discharging the delay capacitor only when the power supply voltage is invalid and after the delay capacitor is substantially discharged, thereby ensuring completion of the delay period before starting a new delay period.

Importantly, the first (input) comparator is coupled to the flipflop so as to force the flipflop to a predetermined state whenever the input power supply voltage falls below its threshold. The flipflop output in turn forces the output reset signal to its invalid state, thereby indicating an invalid input state without any appreciable delay. The delay capacitor voltage does not affect, and does not delay, switching the reset output to the invalid state—only switching to the valid state.

Multiple power supplies may be monitored by providing a scaling resistor network and a comparator for each additional input.

The foregoing and other objects, features and advantages of the invention will become more readily apparent from the following detailed description of a preferred embodiment which proceeds with reference to the drawings.

BRIEF DESCRIPTION OF THE DRAWINGS

FIGS. 3A and 3B are expanded plots ($\times 1000$) showing detail of selected waveforms of FIG. 2 expanded about a time equal to 600 msec.

DETAILED DESCRIPTION OF THE PREFERRED EMBODIMENT

Introduction

Figure 1:
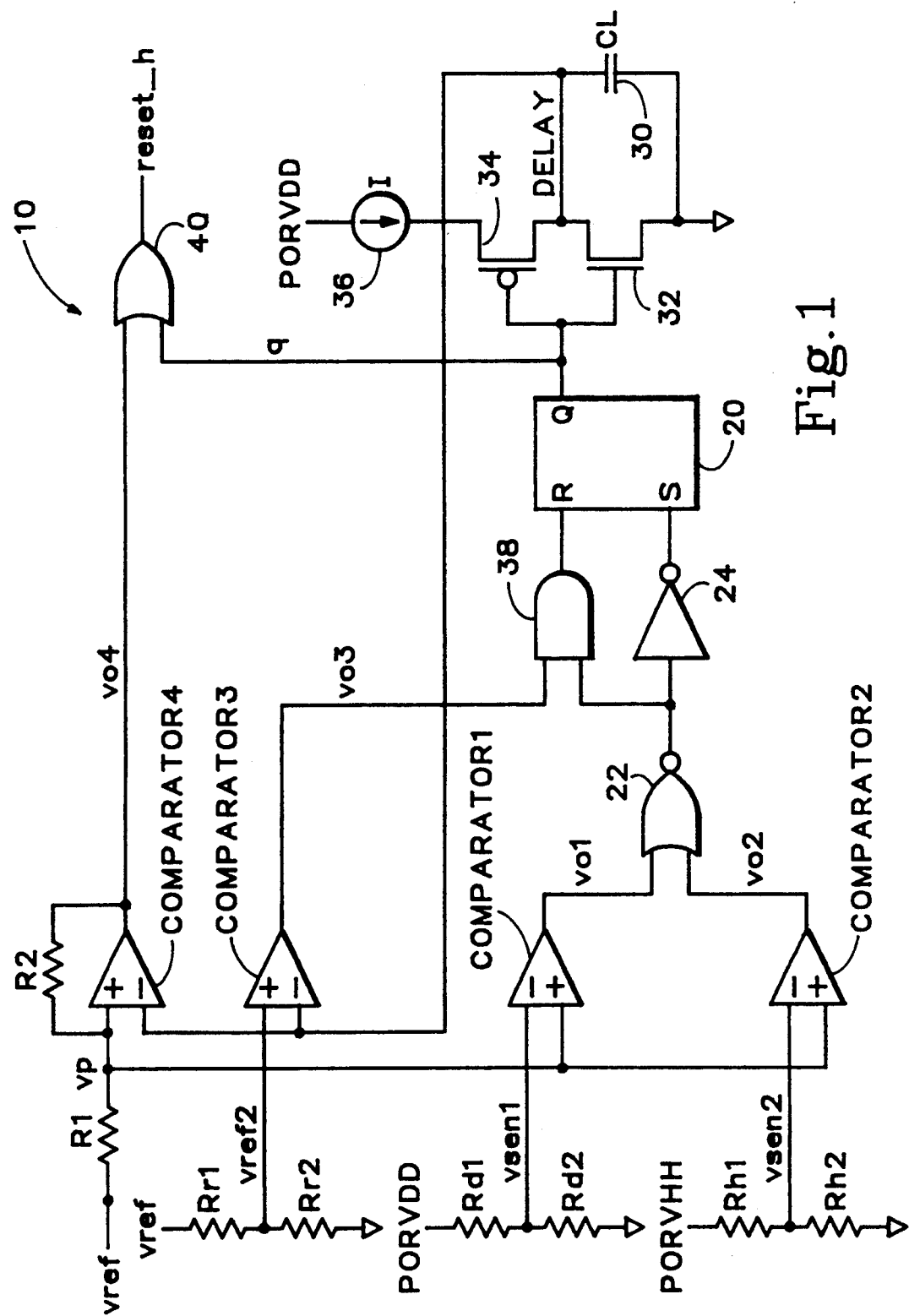
FIG. 1 is a schematic diagram of a CMOS power-on reset circuit according to the present invention.

FIG. 1 is a schematic diagram of a CMOS power-on reset circuit 10 according to the invention. In this embodiment, two power supplies PORVDD and PORVHH are monitored simultaneously. The input voltages PORVDD and PORVHH are scaled down using resistive divider networks. Each of the divided outputs is connected to a corresponding input comparator for comparison to a threshold voltage. The results of those comparisons, together with delay timing described below, are used to provide the power-on reset logic signal reset_h. A low voltage (logic 0) on reset_h is the valid state. It indicates that the monitored power supply voltages have all remained continuously above their respective valid levels for at least a delay period described below.

Threshold Voltage

The threshold voltage vp is generated internally as follows. A first reference voltage vref is a relatively accurate external (or internal) reference voltage. Preferably, vref is derived such that on power-up of the power-on circuit, vref follows PORVDD until it exceeds the steady state value of vref. vp is derived from vref through R1-R2. Comparator 4 is connected in a positive feedback configuration using the R1-R2 resistor network. The purpose of the positive feedback is to provide hysteresis. The value of vp is determined as follows:

$$vp = [R2/(R1+R2)] * vref \text{ for } vo4 = \text{logic } 0$$

$$vp = [R2/(R1+R2)] * vref + [R1/(R1+R2)] * vo4 \text{ for } vo4 = \text{logic } 1.$$

Comparator 4 output vo4 goes low at the end of the delay period. This is when reset_h typically goes low, i.e. to the valid state. Because of summing at the vp node, vp is higher when vo4 is high, and vp drops when vo4 goes low. This lowers the vp threshold voltage.

This arrangement is particularly well suited for applications, such as disk drives, where the power supply will drive a motor. When the reset signal goes valid, the motors go on, causing the power supply voltage to temporarily sag. This can cause the reset signal to switch to the invalid state, shutting off the motors, etc. in an unstable a potentially harmful loop. Lowering the threshold voltage when the reset goes valid avoids this problem.

By providing a threshold voltage itself having hysteresis, the input comparators (comparator 1, comparator 2) need not have hysteresis built into the comparators. This allows for easy expansion of the circuit to simultaneously monitor additional power supply voltages. Each additional power supply to be monitored requires only a suitable resistive divider and a simple comparators. No separate provisions for hysteresis are required, as it is built into the threshold voltage vp. Each resistive divider is designed to scale the corresponding nominal power supply voltage down to the threshold voltage vp.

Input Comparator Circuitry

Input comparators, COMPARATOR 1 and COMPARATOR 2, continuously monitor the applied power supply voltages. The first power supply PORVDD input voltage is divided by a resistive divider network Rd1-Rd2, and the divided output signal vsen1 is input to the inverting input of Comparator 1. Similarly, PORVHH is divided by the Rh1-Rh2 network, and the divided output signal vsen2 is connected to the inverting input of Comparator 2. The non-inverting inputs to Comparators 1 and 2 are coupled to receive the threshold voltage vp. Resistors Rd1-Rd2 and Rh1-Rh2 are ratioed such that when the power supplies PORVDD and PORVHH reach their valid levels, voltages at vsen1 and vsen2 are equal to vp with vo4 high (logic level 1). The input comparator circuitry may be expanded for simultaneously monitoring additional power supplies by providing a similar resistive divider network and input comparator for each power supply.

The output of Comparator 1, vo1 and the output of Comparator 2, vo2 are combined in a NOR logic gate 22. The output of NOR gate 22 is coupled through an inverter 24 to the set input of an RS flipflop 20. (Additional input comparators may be accommodated by expanding the number of inputs of NOR gate 22 as necessary.) Accordingly, when both (or all) power supply voltages are valid, i.e. when all scaled input voltages exceed vp, the output of NOR gate 22 is high (logic 1).

Delay Timing

The delay timing circuitry is described next. The delay timing circuitry includes a delay capacitor 30 and a current source 36 for charging the capacitor 30. Current source 36 is coupled to capacitor 30 through a transistor 34 for charging the capacitor. The capacitor is coupled to ground through a transistor 32 for discharging the capacitor. Transistors 32,34 are complementary so that only one of them is ON at one time. The gates of transistors 34,32 are coupled together to the Q output of flipflop 20 so that when the flipflop output signal (q) goes low (logic 0), transistor 34 turns ON and the delay capacitor begins to charge. Conversely, when q goes high (logic 1), transistor 34 turns OFF and transistor 32 turns ON to discharge the delay capacitor as illustrated in FIG. 3. The state of RS flipflop 20 thus determines whether the delay capacitor is charging or discharging. Delay capacitor 30 remains charged in the normal (valid) steady state.

Comparator 3 continuously monitors the charge or voltage on the delay capacitor 30. A second reference voltage vref2 is derived from the reference voltage vref by a resistive divider network Rr1-Rr2. Comparator 3 has an inverting input coupled to delay capacitor 30 and a non-inverting input coupled to receive the second reference voltage vref2. Accordingly, the output of Comparator 3 vo3 goes high (logic 1) when the delay capacitor voltage falls below vref2. Vref2 is set to a relatively low voltage (about 0.6 volts in an example given below), so that Comparator 3 detects and indicates when the delay capacitor is substantially discharged (see FIG. 3A).

The output of comparator 3 is coupled through a logic AND gate 38 to the reset input of flipflop 20. The second input to AND gate 38 is connected to the output of NOR gate 22. Recall that NOR gate 22 is high (logic 1) when both power supply voltages are valid. The output of Comparator 3 vo3 gates that signal through AND gate 38 to the reset input of flipflop 20. Accordingly, the flipflop can reset Q low, to begin charging the delay capacitor, only when the power supply voltages are valid AND the capacitor is substantially discharged. This is to ensure that at least a full delay period elapses after a most recent power supply glitch before the reset output signal changes to the valid state. The delay period is defined by the time necessary to charge the delay capacitor 30 from a low voltage (i.e. less than vref2) to a higher voltage (vp). This delay time depends on the size of the capacitor, of course, as well as the charging current source 36. It is selected as appropriate for the desired application. For disk drive motor control, for example, a long delay such as 250 msec is desirable. The delay time (td) from when the power supply voltages are valid to the time when reset_h goes low is determined by: $td = (C * vp)/I$ where I is the current provided by current source 36 and C is the capacitance of capacitor 30.

Comparator 4 and Reset Output Signal

Comparator 4 serves the dual purposes of holding the reset signal in the invalid state (logic 1) during the delay period, and providing positive feedback from the reset output to impart hysteresis to the threshold voltage vp. Comparator 4 has an inverting input coupled to the delay capacitor 30 and a non-inverting input coupled to the threshold voltage vp. In the normal steady state, capacitor 30 is charged, so that the output of comparator 4 (vo4) is low (logic 0). This allows the Q output signal (flipflop 30) to pass through an OR gate 40 to provide the reset signal.

In the valid steady state, Q is low (logic 0) so reset_h is low as well. However, when capacitor 30 is discharged and while it is charging, i.e., while its voltage is less than vp, vo4 is high, thereby forcing OR gate 40 and hence the reset signal high, indicating the invalid state. As noted above, when vo4 is high, it also contributes to vp through feedback resistor R2, to provide hysteresis. Consequently, vp is slightly higher during the invalid state.

It should be noted that RS flipflop 20 has its output Q coupled through an OR gate 40. The output of OR gate 40 provides the reset signal useful for resetting or initializing other circuitry within a monolithic CMOS system. Alternatively, or additionally, the reset signal may be brought out to an external pin using appropriate driver or buffer circuitry, details of which are known.

It is noteworthy that the reset signal is not controlled directly from the delay capacitor 30. Rather, the reset signal is isolated from the delay circuit, as will be explained below, in order to avoid delay associated with discharging the delay capacitor, in order to immediately indicate an invalid state of one or more of the input voltages.

Operative Example

In an operative example of the preferred embodiment of the invention, implemented in a CMOS process, components and voltages have values as shown in the following Table.

| | |
|---|---|
| PORVDD | +5 volts |
| PORVHH | +12 volts |
| vref | +2.5 volts |
| vref2 | +0.625 volts |
| vp (power-up) | 2.45–2.563 volts |
| vp (power-down) | 2.536–2.424 volts |
| Rd1 | 8.25 k ohms |
| Rd2 | 10.0 k ohms |
| Rh1 | 31.6 k ohms |
| Rh2 | 10.0 k ohms |

Notes:
1. divider resistors have ±1% variation total for each pair.
2. resistors Rr1 and Rr2 were ratioed 3:1 to generate vref2.

Figure 1A:
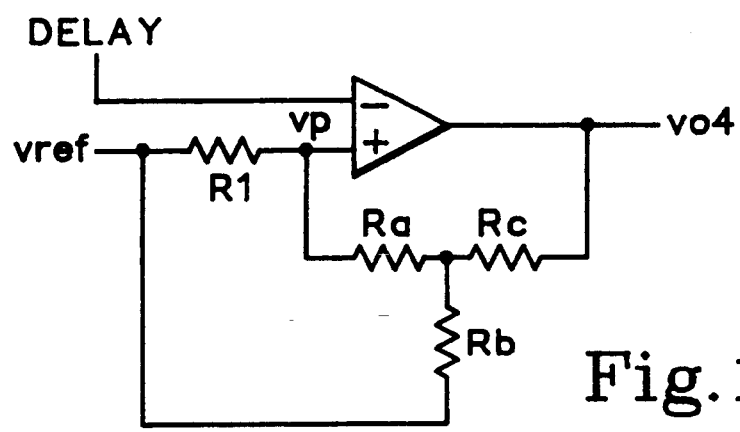
FIG. 1A is a schematic diagram showing an alternative feedback resistor T-network for use in the circuit of FIG. 1.

The parameters specified in the above example are met by ratioing resistors R2 and R1 (see FIG. 1) to a ratio 209:1, resulting in a large area in an integrated circuit. To minimize the area of R2, a T-network topology, as shown in FIG. 1A, was selected. Referring to FIG. 1A, the equivalent resistance Req can be written as:

$$Req = Ra + Rc [1 + (Ra + R1)/Rb]$$

resulting in values $Ra = 50$ k ohms, $Rb = 5$ k ohms, $Rc = 41$ k ohms and $R1 = 2.5$ k ohms.

Any of a variety of known comparator circuits may be used in this application. In one example of the preferred embodiment, a comparator design (not shown) was based on a folded cascode topology. It is important that the comparator be able to operate at low voltage, for example, down to 2 volts. Also, the switching speed of the comparator will affect the power-on circuit response time.

The logic gates (22,24,38,40) and flipflop (20) are known and standard CMOS cells exist for their implementation. The resistor networks may be implemented, for example, using interdigitated polysilicon to attain matching accuracy.

Power-Up Sequencing of the Power-On Circuit

It is generally preferred that a power-on circuit itself "power-on" initially asserting the reset signal in the invalid state, thereby ensuring a proper initialization of other circuitry only after the power supply voltage(s) are valid and have stabilized. When power is first applied to the present circuit, it operates as follows. Assume that the power supply input voltages PORVDD and PORVHH are ramped upward. The reference voltage vref is derived such that on power-on vref follows PORVDD until it exceeds the steady state value of vref. During power supply ramp up, vsen1 and vsen2 are less than vref (vp≈vref) causing vo1 and vo2 to be high (assuming vref has not reached its steady state value). A logic 1 on vo1 or vo2 sets Q high, discharging the delay capacitor 30 through transistor 32. This ensures that any initial bias or stray charge on the capacitor is removed. The logic 1 at Q also sets reset_h high, indicating an invalid state of the power supplies.

As PORVDD continues to increase vref attains its steady state value. When both the power supplies reach their valid levels, and vsen1, vsen2 exceed vp by a small increment Δv, outputs vo1 and vo2 switch to logic 0 and flipflop 20 is switched to its reset mode, i.e., Q is logic 0. As a result, current source 36 begins to charge capacitor 30. This begins the delay time period.

Note that at this time vo4 (the output of Comparator 4) is high (vp>DELAY). This holds reset_h high (the invalid state) until the capacitor is charged to vp, regardless of the flipflop state (Q), which now is low (logic 0). At a conclusion of the delay period, i.e. when the capacitor voltage exceeds vp by a small amount, vo4 goes low. Assuming that Q is still low, the reset output signal (reset_h) is switched to logic 0, the valid state.

Steady-State Operation

At any time that either one or both of the power supplies' voltage falls below its valid voltage level, the corresponding input comparator switches to a logic 1, and that signal propagates through gates 22,24 to set flipflop 20 so that Q goes high. Q high immediately drives OR gate 40 high and hence the reset signal reset_h immediately switches to logic 1, indicating an invalid power supply voltage. An advantage of the invention is that this indication of an invalid power supply voltage does not await discharge of the delay capacitor. This feature is best illustrated in FIGS. 3A and 3B, described below.

When the power supply voltage returns to a valid level, the input comparators again are low, so gate 22 goes high. However, gate 38 prevents resetting the flipflop, as noted above, until Comparator 3 indicates (vo3 high) that the capacitor has substantially discharged. This set-up ensures that at least the delay period (td) is provided every time the power supply input voltage becomes invalid.

Illustrative Simulation Results

Figure 2A:
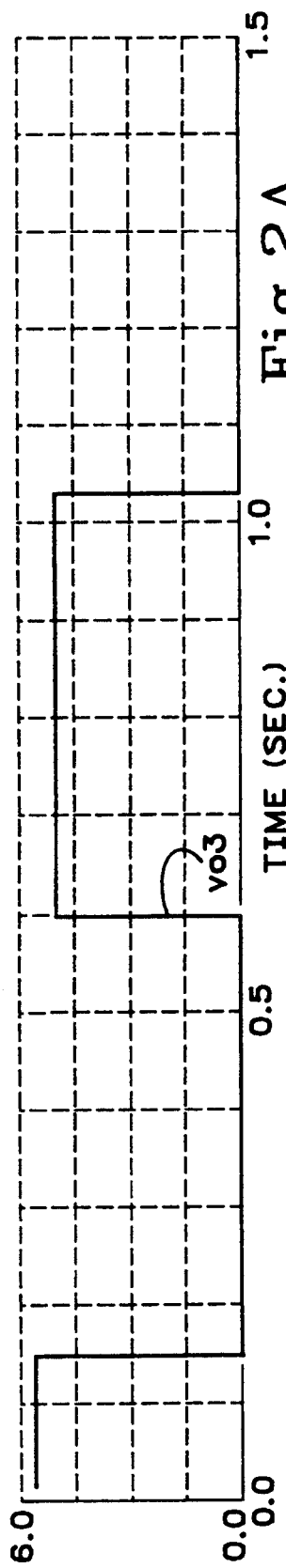
FIGS. 2A through 2E are simulation plots illustrating operation of the circuit of FIG. I modified so as to employ the alternative feedback resistor network of FIG. 1A.
Figure 2B:
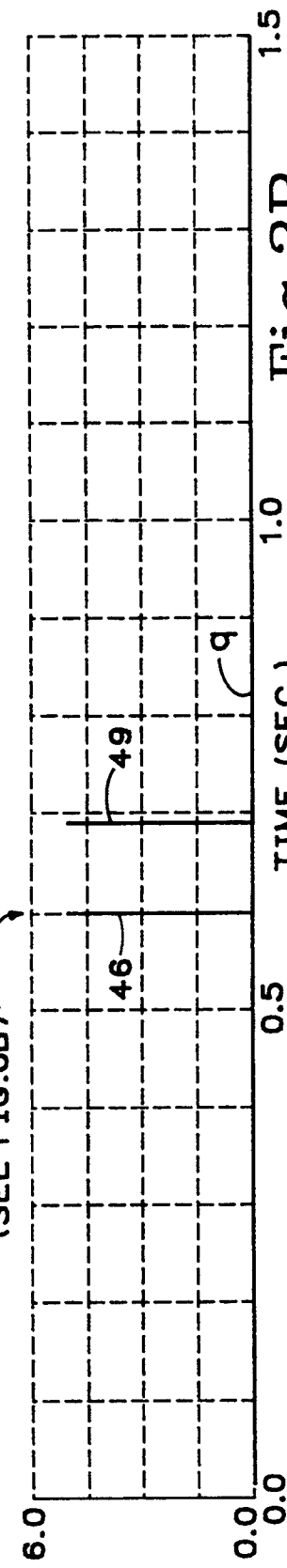
Figure 2C:
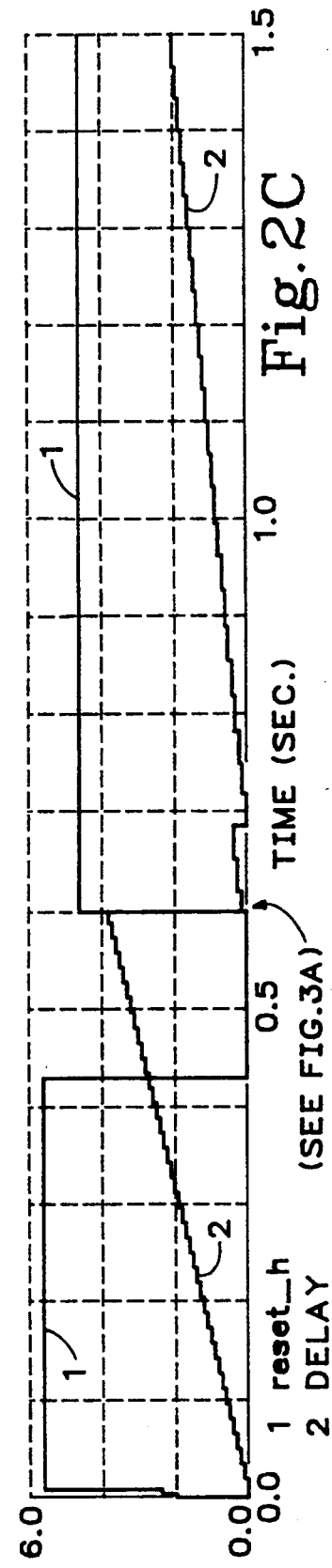
Figure 2D:
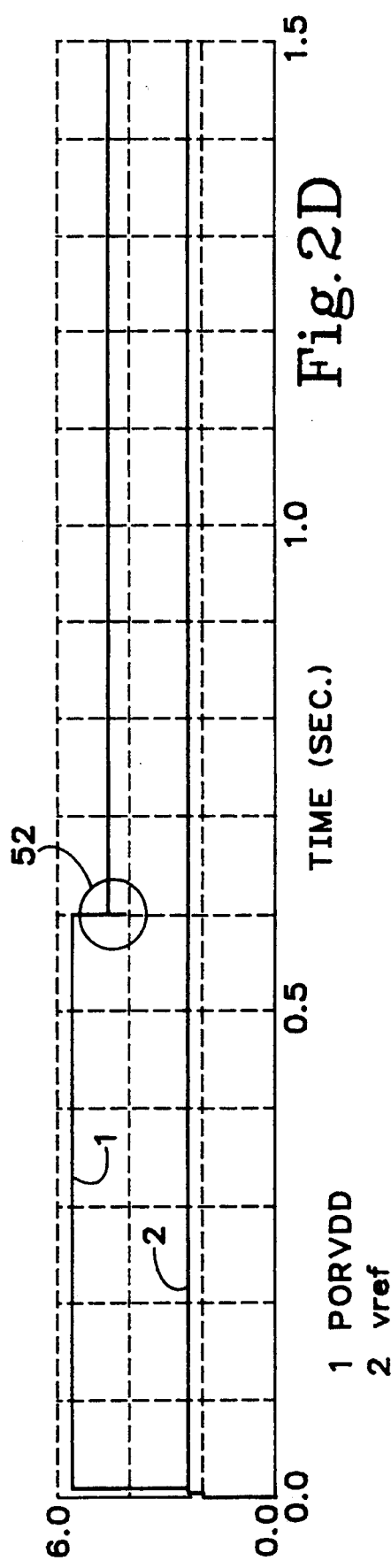
Figure 2E:
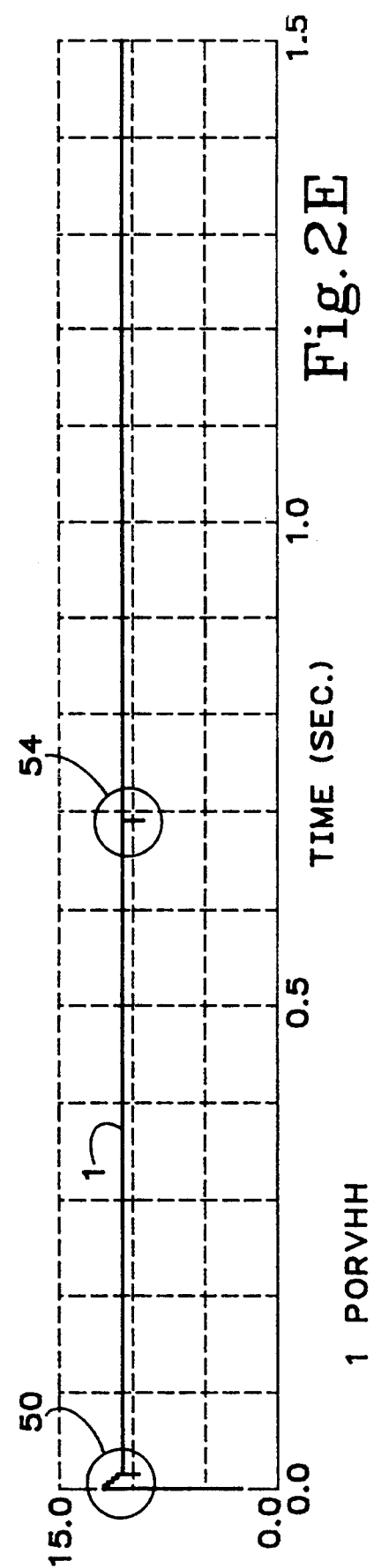

Operation of the power-on circuit 10 is illustrated in the simulation plots of FIGS. 2A through 2E. FIGS. 2A through 2E share a common horizontal scale which represents time. Each horizontal division corresponds to approximately 100 msec. FIG. 2A shows the comparator output signal vo3. FIG. 2B shows the flipflop output signal q. FIG. 2C shows the reset signal reset_h and the delay capacitor voltage DELAY. FIG. 2D shows the PORVDD supply voltage along with the reference voltage vref. Finally, FIG. 2E shows the second power supply input voltage PORVHH. The vertical scales, representing voltage, are labeled as appropriate. FIGS. 2A through 2D thus employ two volts per vertical division while FIG. 2E is scaled to 5 volts per division.

Initially, the two power supply input voltages ramp up to their nominal values. PORVHH becomes valid almost immediately, and PORVDD becomes so within approximately 10 msec. Shortly thereafter, referring to FIG. 2E, PORVHH exhibits a brief negative spike 50, at around 20 msec. Referring now to FIG. 2C, this spike delays (or restarts) charging the delay capacitor, so the voltage DELAY does not begin to rise until after the spike 50 has subsided. During the period approximately 25 msec to 400 msec, the reset_h output is held high (invalid), as the DELAY voltage on the capacitor rises, as shown in FIG. 2C.

FIG. 2A shows the vo3 signal, which initially is high, indicating that the delay capacitor is substantially discharged (DELAY<vref2). At approximately 150 msec, DELAY crosses vref2, and vo3 goes low. This prevents the input comparator output signals (not shown) from resetting the flipflop, even though the power supply voltages are now valid. At approximately 430 msec, DELAY crosses vp (around 2.5 volts) so vo4 goes low (not shown). Since q is still low (FIG. 2B), reset_h now goes low, as shown in FIG. 2C, indicating a valid state of affairs.

Referring now to FIG. 2D, at approximately 600 msec, PORVDD exhibits a brief negative spike 52 during which the voltage falls below its valid level. PORVDD soon recovers to a valid voltage level, albeit somewhat lower than its initial level. Spike 52 switches vo1 high, which propagates through flipflop 20 to set Q high, which in turn drives reset_h high (see FIG. 2C), thereby indicating an invalid state. The delay capacitor is discharged, so DELAY falls to zero. Since PORVDD immediately recovered to a valid level, and since vo3 again is high (capacitor discharged), the flipflop is quickly reset so q goes low, starting to recharge the delay capacitor. The q signal thus exhibits a brief positive spike 46 at this time.

FIGS. 3A and 3B are zoom plots, expanded about the 600 msec point, to show detail of the reset_h, DELAY and vo3 signals (FIG. 3A) and the q signal (FIG. 3B). In response to the glitch on PORVDD at 600 msec (FIG. 2D), reset_h immediately goes high (invalid). The capacitor begins to discharge so DELAY decays. After about 2 msec, DELAY crosses vref2, so vo3 goes high. Referring to FIG. 3B, q goes high immediately in response to the input glitch. Even though the power supply PORVDD recovered to a valid voltage level immediately, q is held high because vo3 is low, until the capacitor has substantially discharged. Then vo3 goes high, allowing the flipflop to reset, so q goes low. At this time, after 602 msec, recharging begins.

Referring again to FIG. 2E, the PORVHH supply voltage exhibits a second negative spike 54, this time at about 690 msec. Spike 54 includes an excursion below the PORVHH valid level. Accordingly, spike 54 switches vo2 high, once again setting the flipflop (q goes high), and discharging the capacitor (see FIGS. 2B and 2C). As soon as PORVHH becomes valid, since vo3 is high, q is reset (to logic 1) and the capacitor begins to recharge again. The reset output signal reset_h remains high (invalid) throughout this time, held in that state by vo4 as the capacitor voltage DELAY remains below vp. As shown in FIG. 2C, recharging continues for the remainder of the plot. Reset_h remains high (invalid). The DELAY voltage ramps up at a lower slope than it did initially, due to the dependence of current source 36 (FIG. 1) on the PORVDD supply voltage. Finally, referring to FIG. 2A, vo3 goes low at approximately 1300 msec, as DELAY exceeds vref2.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A power-on circuit for generating a binary reset output signal having a valid state and an invalid state, comprising:
    input means for receiving and scaling a power supply voltage to be monitored;
    threshold voltage means for providing a threshold voltage;
    first comparator means for comparing the scaled power supply voltage to the threshold voltage and indicating a valid power supply state when the power supply voltage exceeds the threshold voltage and for indicating an invalid power supply state otherwise;
    a delay timer for providing a predetermined delay period and indicating completion of the delay period; the delay timer including:
    a delay capacitor;
    a current source for charging the delay capacitor;
    a first transistor switch disposed between the current source and the delay capacitor to control charging of the capacitor;
    a second transistor switch coupled to the capacitor for controllably discharging the capacitor; and
    a flip-flop having a Q output coupled to the first and second switches for charging and discharging the delay capacitor, respectively, in response to a current state of the flip-flop;
    means for starting the delay timer responsive to the indication of a valid power supply state;
    means for delaying said starting the delay timer until after the delay timer indicates completion of the delay period, to ensure that at least the delay period elapses since the power supply last becoming invalid before changing the reset output signal to the valid state; and
    means coupled to the first comparator means for forcing the reset output signal to an invalid state responsive to the indication of an invalid power supply state and without regard to the delay period, thereby immediately forcing the reset signal to the invalid state without delay and wherein
    said means for starting the delay timer include means for resetting the flip-flop thereby enabling the first transistor switch to begin charging the delay capacitor responsive to the indication of the invalid state; and
    and means for delaying said starting the delay timer include a voltage comparator having a first input coupled to the delay capacitor and a second input coupled to a reference voltage and an output coupled to logic means for resetting the flipflop only after the capacitor voltage crosses the reference voltage.

2. A power-on circuit according to claim 1 further comprising:
    means for discharging the delay capacitor in response to the indication of an invalid power supply state;
    means for recharging the delay capacitor in response to the indication of a valid power supply state; and
    gating means for disabling the recharging means to prevent recharging the delay capacitor until after the delay capacitor has discharged to a predetermined voltage, thereby ensuring that at least the delay time period has elapsed since the invalid state was cleared before asserting the reset signal.

3. A power-on circuit according to claim 1 further comprising:
    third comparator means having a first input coupled to receive the delay capacitor voltage and a second input coupled to a threshold voltage node for indicating completion of the delay time period responsive to the delay capacitor voltage crossing the threshold voltage;

means responsive to the indication of completion of the delay period for asserting the reset output signal to a valid state; and feedback means coupled between the third comparator output and the second input for shifting the threshold voltage responsive to the state of the reset output signal.

4. A power-on circuit according to claim 1 further comprising logic means for gating the flipflop output as the reset output signal only after the indication of completion of the delay period.

5. A method of generating a power-on reset signal responsive to a power supply input voltage comprising:
   initially asserting the reset signal in a predetermined invalid state;
   providing a threshold voltage having an initial value;
   comparing the input voltage to the threshold voltage;
   after at least a predetermined delay period has elapsed during which delay period the input voltage continuously exceeds the threshold voltage, switching the reset signal to a valid state;
   responsive to said switching step, lowering the threshold voltage;
   comparing the input voltage to the lowered threshold voltage, thereby permitting the input voltage to sag after initialization without switching the reset signal back to the invalid state;
   responsive to the input voltage falling below the lowered threshold voltage, immediately switching the reset signal back to the invalid state without delay;
   maintaining the reset signal in the invalid state for at least the delay period without regard to the input voltage level; and
   upon a conclusion of at least the delay period, restoring the threshold voltage to its initial value.

6. A method according to claim 5 including monitoring a delay capacitor voltage to ascertain the delay period; and wherein
   said maintaining the reset signal in the invalid state includes: comparing the delay capacitor voltage to the lowered threshold voltage; and
   forcing the reset signal to the invalid state until the delay capacitor charges to a voltage level that exceeds the lowered threshold voltage.

7. A method of generating a power-on reset signal responsive to a power supply input voltage comprising:
   initially asserting the reset signal in a predetermined invalid state;
   providing a threshold voltage having an initial value;
   comparing the input voltage to the threshold voltage;
   after at least a predetermined delay period has elapsed during which delay period the input voltage continuously exceeds the first threshold voltage, switching the reset signal to a valid state;
   responsive to said switching step,
   comparing the threshold voltage to a delay capacitor voltage to detect a conclusion of the delay period when the delay capacitor voltage exceeds the threshold voltage; and
   lowering the threshold voltage responsive to detecting the conclusion of the delay period and then comparing the input voltage to the lowered threshold voltage, thereby permitting the input voltage to sag after initialization without switching the reset signal back to the valid state.

8. A method of generating a power-on reset signal responsive to a power supply input voltage comprising:
   initially asserting the reset signal in a predetermined invalid state;
   providing a threshold voltage having an initial value;
   comparing the input voltage to the threshold voltage;
   providing a delay capacitor;
   responsive to a invalid power supply input voltage, discharging the delay capacitor;
   continuously monitoring the delay capacitor voltage and indicating when the delay capacitor is substantially discharged;
   responsive to a valid input voltage, and only if the delay capacitor is substantially discharged, recharging the delay capacitor;
   comparing the delay capacitor voltage to the threshold voltage;
   responsive to an indication that the delay capacitor voltage exceeds the threshold voltage, so that at least a predetermined delay period has elapsed during which delay period the input voltage continuously exceeded the first threshold voltage, and only if the input voltage is valid, switching the reset signal to the valid state;
   responsive to said switching step, lowering the threshold voltage; and
   comparing the input voltage to the lowered threshold voltage, thereby permitting the input voltage to sag after initialization without switching the reset signal back to the invalid state.

9. A method of generating a power-on reset signal in a CMOS integrated circuit responsive to a power supply input voltage comprising:
   providing first and second voltage comparators and a latch;
   in the first comparator, continuously comparing the power supply input voltage to a threshold voltage to form an indication that the input voltage is valid;
   in the second comparator, continuously monitoring a capacitor voltage to form an indication when the capacitor is substantially discharged;
   when the input voltage is valid and the capacitor is substantially discharged, setting the latch to a first state to begin recharging the capacitor; and
   responsive to the input voltage falling below the threshold voltage, setting the latch to a second state to being discharging the capacitor and setting the reset output signal to the invalid state, whereby setting the reset signal to the invalid state does not await discharging of the capacitor.

10. A method according to claim 9 further comprising:
   providing a third voltage comparator;
   in the third comparator, continuously comparing the capacitor voltage to a reference voltage; and
   after the capacitor voltage exceeds the reference voltage, if the input voltage exceeds the threshold voltage, setting the reset output signal to the valid state.

11. A method according to claim 10 further comprising shifting the threshold voltage.

* * * * *